US008634734B2

(12) United States Patent
Okumura

(10) Patent No.: US 8,634,734 B2
(45) Date of Patent: Jan. 21, 2014

(54) POWER SUPPLY CIRCUIT FOR SUPPLYING POWER TO ELECTRONIC DEVICE SUCH AS IMAGE FORMING APPARATUS

(75) Inventor: Yasuhiko Okumura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 254 days.

(21) Appl. No.: 13/218,325

(22) Filed: Aug. 25, 2011

(65) Prior Publication Data
US 2012/0070178 A1 Mar. 22, 2012

(30) Foreign Application Priority Data

Sep. 17, 2010 (JP) ................................. 2010-209883

(51) Int. Cl.
G03G 15/06 (2006.01)
G03G 15/00 (2006.01)

(52) U.S. Cl.
USPC .............................................. 399/55; 399/88

(58) Field of Classification Search
USPC .................. 399/43, 55, 88, 270, 285; 363/78; 323/282, 284, 355
See application file for complete search history.

(56) References Cited

U.S. PATENT DOCUMENTS

| 4,947,312 | A | * | 8/1990 | Tsuruoka et al. ............. 363/134 |
| 5,663,744 | A | | 9/1997 | Seike et al. |
| 7,791,908 | B2 | * | 9/2010 | Na et al. ...................... 363/21.02 |
| 8,135,295 | B2 | * | 3/2012 | Hamada ........................... 399/55 |
| 8,213,823 | B2 | | 7/2012 | Yamamoto |
| 8,265,511 | B2 | * | 9/2012 | Kosaka et al. ................... 399/88 |
| 8,311,429 | B2 | * | 11/2012 | Okumura ......................... 399/55 |
| 8,437,652 | B2 | * | 5/2013 | Nagasaki ......................... 399/88 |
| 2008/0055296 | A1 | | 3/2008 | Miyazawa |
| 2010/0209132 | A1 | * | 8/2010 | Takami ............................ 399/88 |
| 2012/0070177 | A1 | * | 3/2012 | Okumura ......................... 399/88 |

FOREIGN PATENT DOCUMENTS

| CN | 1159599 | A | | 9/1997 |
| CN | 101141841 | A | | 3/2008 |
| CN | 201248085 | Y | | 5/2009 |
| CN | 101771352 | A | | 7/2010 |
| JP | 61173670 | A | * | 8/1986 |
| JP | 10313573 | A | * | 11/1998 |
| JP | 2002-354831 | | | 12/2002 |

OTHER PUBLICATIONS

U.S. Appl. No. 13/217,782, filed Aug. 25, 2011 by Yasuhiko Okumura.
Chinese Office Action dated Sep. 16, 2013 in Chinese counterpart Appl. No. 201110281859.0.

* cited by examiner

Primary Examiner — Robert Beatty
(74) Attorney, Agent, or Firm — Fitzpatrick, Cella, Harper & Scinto

(57) ABSTRACT

A voltage conversion unit converts alternating current voltage generated by an alternating current voltage generation unit into a predetermined output voltage. An adjustment unit monitors the output voltage and adjusts a driving pattern for driving the alternating current voltage generation unit in accordance with a waveform distortion generated in a rectangular wave of the output voltage. The driving pattern is a pattern having, in a half cycle of the rectangular wave of the alternating current voltage, a first ON period during which the alternating current voltage is applied to the voltage conversion unit, an OFF period during which the alternating current voltage is not applied to the voltage conversion unit, and a second ON period during which the alternating current voltage is applied to the voltage conversion unit. The adjustment unit adjusts a ratio of the first ON period, the OFF period, and the second ON.

10 Claims, 11 Drawing Sheets

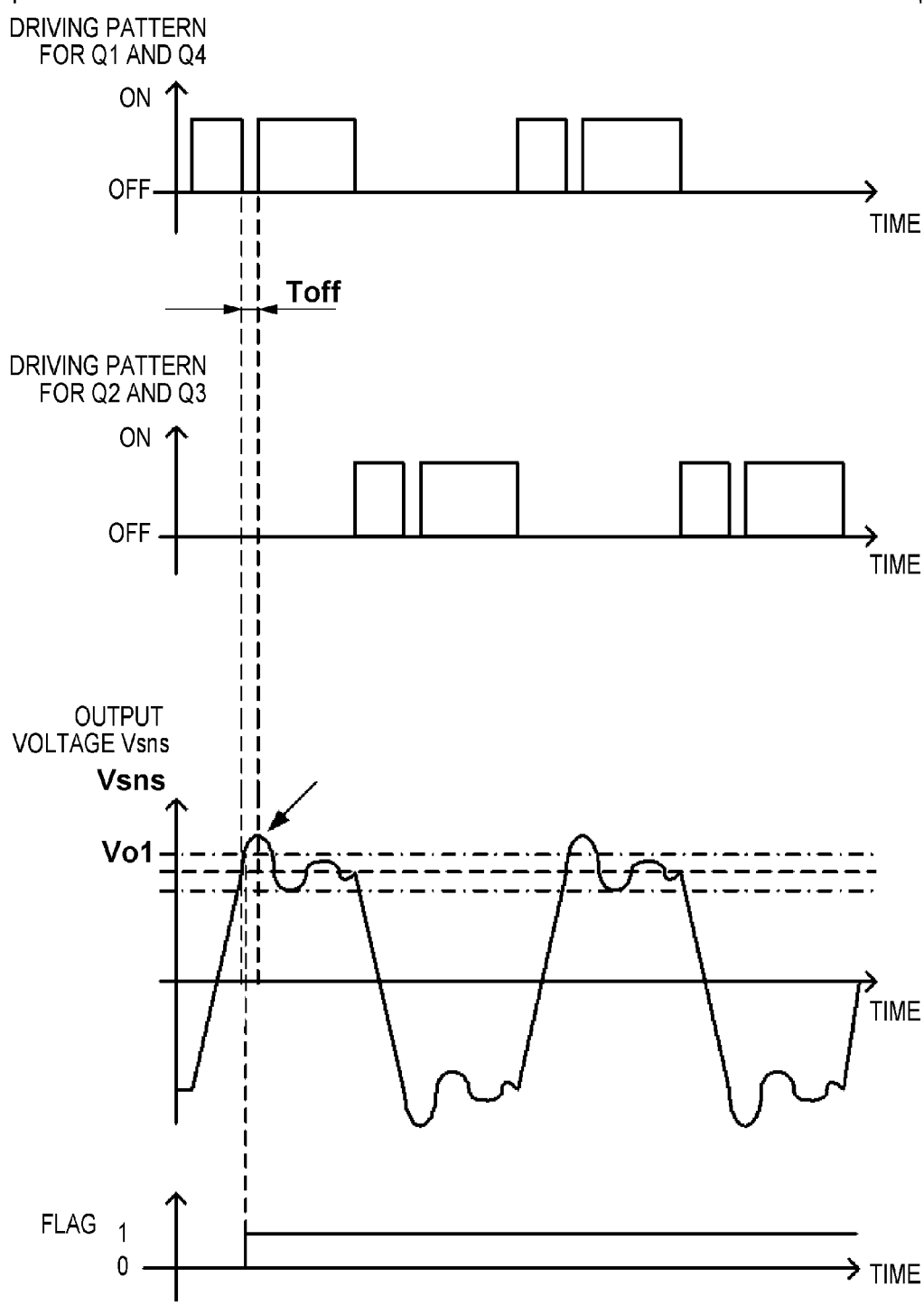

FIG. 5B
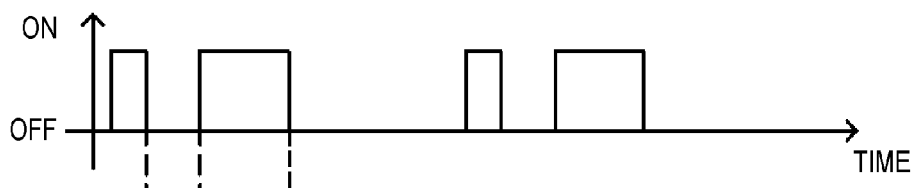
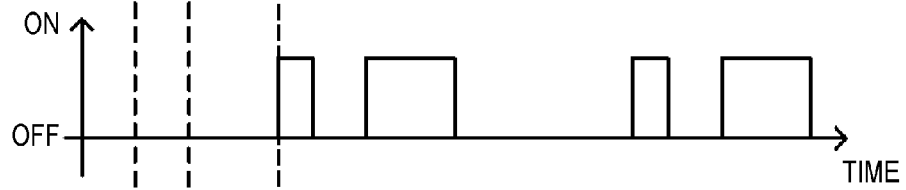
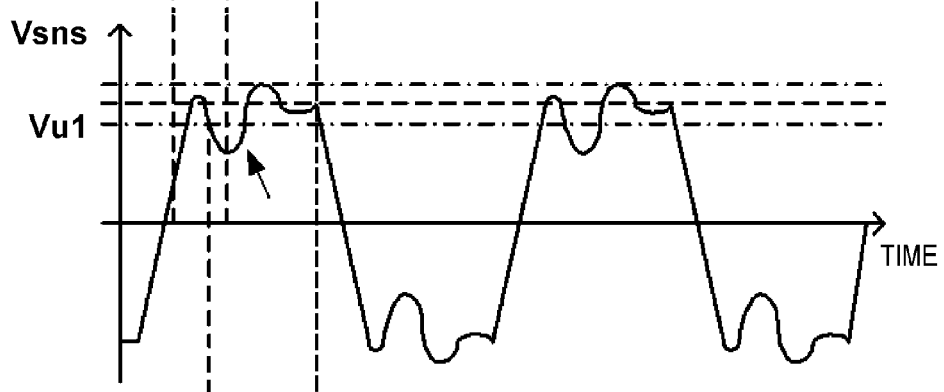
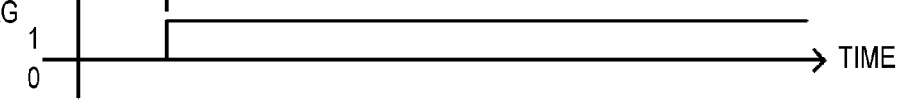

POWER SUPPLY CIRCUIT FOR SUPPLYING POWER TO ELECTRONIC DEVICE SUCH AS IMAGE FORMING APPARATUS

BACKGROUND OF THE INVENTION

1. Field of the Invention

The present invention relates to a power supply circuit for supplying power to an electronic device such as an image forming apparatus.

2. Description of the Related Art

A developing device in an electrophotographic or electrostatic printing image forming apparatus efficiently develops an electrostatic latent image with toner by applying, to a developing sleeve, a voltage in which DC (Direct Current) and AC (Alternating Current) voltages are superposed. In particular, an AC voltage having a rectangular waveform increases the charging efficiency of toner with respect to a latent image (ratio at which toner charges couple with latent image charges).

A voltage applied to the developing sleeve needs to have a target value. This is because various problems arise if an applied voltage greatly exceeds a target voltage to generate an overshoot. For example, a current flows through an unintended conductor via the surface of an insulator or an air layer. Also, aerial discharge occurs in a conductive impurity mixed in a developing agent, damaging a latent image. As one solution to relieve these problems, a damping resistor having a sufficiently large resistance value is adopted.

However, the use of the damping resistor also has disadvantages. For example, the rise and fall responses become slower than those of an ideal rectangular wave, resulting in a blunt rectangular wave. The blunt rectangular wave is poorer in charging efficiency than the ideal rectangular wave. The power loss across the damping resistor accounts for half the input power to an AC voltage generation circuit, increasing the space for permitting the energy loss and raising the component cost.

In Japanese Patent Laid-Open No. 2002-354831, an AC voltage generation circuit is formed from a full bridge circuit made up of four switching elements. A predetermined OFF period is set in part of a period during which each switching element is turned on. This arrangement relieves an overshoot without depending on a damping resistor.

The invention disclosed in Japanese Patent Laid-Open No. 2002-354831 can correct an output waveform distortion by LC resonance satisfactorily for a developing unit, photosensitive member, developing high-voltage power supply, and developing agent under a given condition. However, a transformer connected to the AC voltage generation circuit varies in leakage inductance owing to an individual difference. The magnitude of even a capacitance formed by the gap between the developing sleeve and the photosensitive member varies depending on mounting of the developing sleeve and photosensitive member (gap tolerance). The resonant waveform changes depending on the leakage inductance and load capacitance. In the above invention, the first ON period, OFF period, and second ON period of the switching element need to be set for an individual image forming apparatus. Recently, the gap between the developing sleeve and the photosensitive member tends to be smaller for higher charging efficiency. The capacitance C1 by the gap is given by $$C1 = \epsilon S/d$$

$\epsilon$: permittivity

S: facing area between the developing sleeve and the photosensitive member at a portion which contributes to development d: facing distance between the developing sleeve and the photosensitive member As long as the variation tolerance $\Delta d$ does not change, even if the gap distance d decreases, $\Delta d$ becomes larger than d. Since the capacitance C1 is inversely proportional to the distance d, the variation sensitivity of the capacitance C1 to $\Delta d$ increases. In addition to the individual difference of the image forming apparatus, new variations may be generated even after shipment. For example, the photosensitive member and developing unit are consumables and are sometimes exchanged. Also, an abutting member which regulates the gap distance d between the developing sleeve and the photosensitive member galls. Further, a member may deform by temperature and humidity. The impedance of a path from the developing high-voltage power supply circuit to the developing sleeve and photosensitive member may change. Under the circumstances, even if the ON and OFF periods of the switching element are adjusted not to generate a distortion upon shipment, the resonant waveform changes over time. Especially, a waveform in an image forming apparatus which omits the damping resistor or decreases the number of damping resistors is higher in sensitivity to a change of the capacitance C1 than a waveform which is blunted sufficiently by the damping resistor. Accordingly, the waveform changes from an ideal rectangular wave, hindering stable development.

SUMMARY OF THE INVENTION

It is a feature of the present invention to achieve stable development while decreasing dependence on a damping resistor by maintaining the shape of a rectangular wave even if the magnitude of the inductance or capacitance changes dynamically.

The preset invention provides a power supply circuit comprising the following elements.

An alternating current voltage generation unit generates an alternating current voltage having a shape of a rectangular wave. A voltage conversion unit converts alternating current voltage generated by the alternating current voltage generation unit into a predetermined output voltage. An adjustment unit monitors the output voltage and adjusts a driving pattern for driving the alternating current voltage generation unit in accordance with a waveform distortion generated in a rectangular wave of the output voltage. The driving pattern is a pattern having, in a half cycle of the rectangular wave of the alternating current voltage, a first ON period during which the alternating current voltage is applied to the voltage conversion unit, an OFF period during which the alternating current voltage is not applied to the voltage conversion unit, and a second ON period during which the alternating current voltage is applied to the voltage conversion unit. The adjustment unit adjusts a ratio of the first ON period, the OFF period, and the second ON so that the waveform distortion decreases.

Further features of the present invention will become apparent from the following description of exemplary embodiments (with reference to the attached drawings).

BRIEF DESCRIPTION OF THE DRAWINGS

FIGS. 5A and 5B are waveform charts each exemplifying the waveform of an output voltage that requires adjustment of the driving pattern;

DESCRIPTION OF THE EMBODIMENTS

First Embodiment

Figure 1:
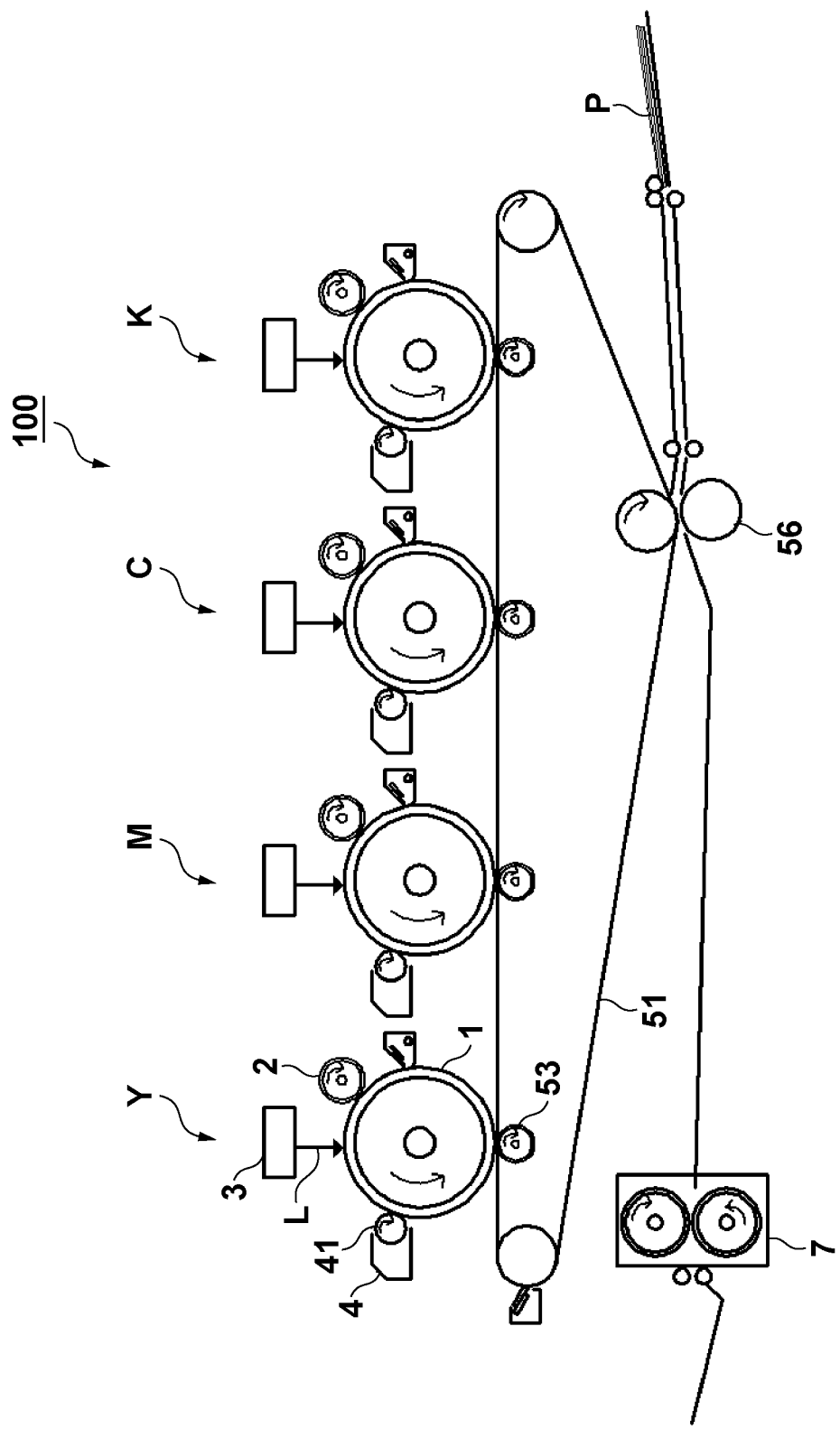
FIG. 1 is a schematic sectional view showing an image forming apparatus.

An image forming apparatus 100 shown in FIG. 1 is an electrophotographic multi-color image forming apparatus including a power supply circuit according to the present invention. Note that the present invention is applicable to even a monochrome image forming apparatus. The image forming apparatus 100 includes four image forming stations Y, M, C, and K which form images with developing agents (toners) of different colors, that is, yellow, magenta, cyan, and black. The image forming stations have basically the same arrangement, and the yellow image forming station will be explained as a representative.

When a host controller 210 (FIG. 2) which controls the overall image forming apparatus 100 receives an instruction to form an image on a printing medium P, a photosensitive member 1, intermediate transfer belt 51, charging roller 2, developing sleeve 41, primary transfer roller 53, secondary transfer roller pair 56, and fixing unit 7 start rotating. A DC voltage or a high voltage obtained by superposing a sinusoidal voltage on a DC voltage is applied from a high-voltage power supply (not shown) to the charging roller 2. The surface of the photosensitive member 1 in contact with the charging roller 2 is charged to the same potential as the DC voltage uniformly applied from the high-voltage power supply. Then, the surface of the photosensitive member 1 rotates to move to the position of laser irradiation from an exposure device 3. The exposure device 3 emits light L corresponding to an image signal, forming an electrostatic latent image. A power supply device 200 shown in FIG. 2 applies, to the developing sleeve 41 of a developing unit 4, a high voltage (developing bias) obtained by superposing an AC voltage (voltage of a rectangular wave) on a DC voltage. The developing bias generates negative charges in toner. The toner develops a positive-potential latent image from the developing sleeve 41, forming a toner image. The developing sleeve 41 is an example of a developing member to which a voltage supplied from the power supply device is applied. The photosensitive member 1 is an example of an image carrier which bears an electrostatic latent image that is developed with a developing agent supplied from the developing member. The toner image on the surface of the photosensitive member 1 moves and reaches the primary transfer roller 53 as the photosensitive member 1 rotates. Then, the toner image is transferred onto the intermediate transfer belt 51. Note that Y, M, C, and K toner images are registered and transferred onto the intermediate transfer belt 51. Finally, toner images of multiple colors are superposed and formed on the intermediate transfer belt 51. The intermediate transfer belt 51 is another example of the image carrier. The multi-color toner image on the surface of the intermediate transfer belt 51 moves and reaches the secondary transfer roller pair 56 as the belt 51 rotates. The secondary transfer roller pair 56 transfers the multi-color toner image onto the printing medium P. The secondary transfer roller pair 56 is an example of a transferring member which transfers a developing agent image from the image carrier onto a printing medium. The fixing unit 7 fixes, to the printing medium P by pressure and temperature, the toner image transferred on the printing medium P.

Figure 2:
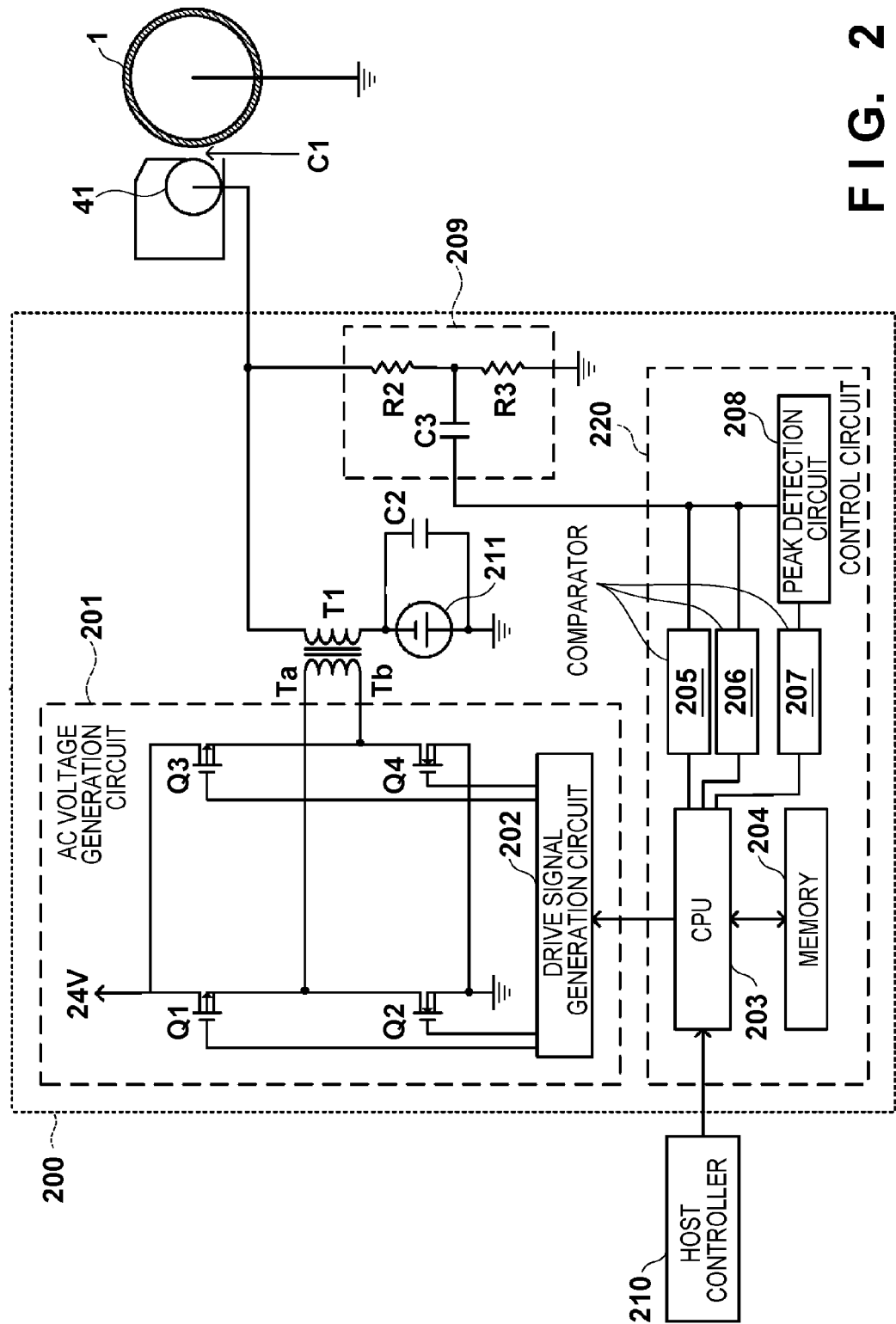
FIG. 2 is a circuit diagram showing a power supply device.

FIG. 2 shows a power supply device 200 which generates a developing bias, the developing unit 4, and the photosensitive member 1. The power supply device 200 includes an AC voltage generation circuit 201, a transformer T1, a DC voltage source 211 which generates a DC voltage, a voltage detection circuit 209, and a control circuit 220.

The AC voltage generation circuit 201 functions as an AC voltage generation unit which generates an AC voltage having the shape of a rectangular wave. The AC voltage generation circuit 201 includes four semiconductor switching elements Q1, Q2, Q3, and Q4, and a drive signal generation circuit 202. The four semiconductor switching elements Q1, Q2, Q3, and Q4 form a full bridge circuit for the transformer T1. The transformer T1 functions as a voltage converter which converts an AC voltage generated by the AC voltage generation unit into a predetermined output voltage. The AC voltage generation circuit 201 and transformer T1 generate and output an AC voltage (rectangular wave) to be superposed on a DC voltage. In accordance with an output instruction from a CPU 203, the drive signal generation circuit 202 outputs gate signals to turn on Q1, off Q2, off Q3, and on Q4. As a result, a voltage is applied so that the potential at a transformer winding end Ta becomes higher than that at Tb, generating a voltage with a positive amplitude in the secondary winding. Similarly, in accordance with an output instruction, the drive signal generation circuit 202 outputs gate signals to turn off Q1, on Q2, on Q3, and off Q4. Then, a voltage is applied so that the potential at the transformer winding end Tb becomes higher than that at Ta, generating a voltage with a negative amplitude in the secondary winding.

The voltage detection circuit 209 includes a voltage division circuit made up of resistors R2 and R3, and a capacitor C3 connected to the voltage division circuit. The voltage detection circuit 209 detects an AC voltage (output voltage) output from the transformer T1. The voltage detection circuit 209 outputs the detected output voltage to the control circuit 220.

In the control circuit 220, a comparator 205 uses, as a threshold, an upper limit output value Vo1 which is determined in consideration of a permissible error with respect to a target amplitude value. A comparator 206 uses, as a threshold, a lower limit output value Vu1 which is determined in consideration of a permissible error with respect to a target amplitude value. A peak detection circuit 208 derives a peak voltage Vp of a detected output voltage Vsns. A comparator 207 compares the peak voltage Vp with thresholds Vo2 and Vu2. The CPU 203 is an arithmetic unit which determines a driving pattern based on comparison results output from the comparators 205, 206, and 207. That is, the CPU 203 functions as an adjustment unit which monitors an output voltage and adjusts a driving pattern for driving the AC voltage generation unit in accordance with a waveform distortion generated in the rectangular wave of an output voltage. The driving pattern is a pattern having, in the half cycle of the rectangular wave of the AC voltage, the first ON period during which an AC voltage is applied to the voltage converter, an OFF period during which no AC voltage is applied to the voltage converter, and the second ON period during which an AC voltage is applied to the voltage converter (for example, FIG. 4). The CPU 203 adjusts the driving pattern by adjusting the ratio of the first ON period, OFF period, and second ON period to reduce a waveform distortion. A memory 204 stores the driving pattern determined by the CPU 203.

[Basic Operation]

Figure 3:
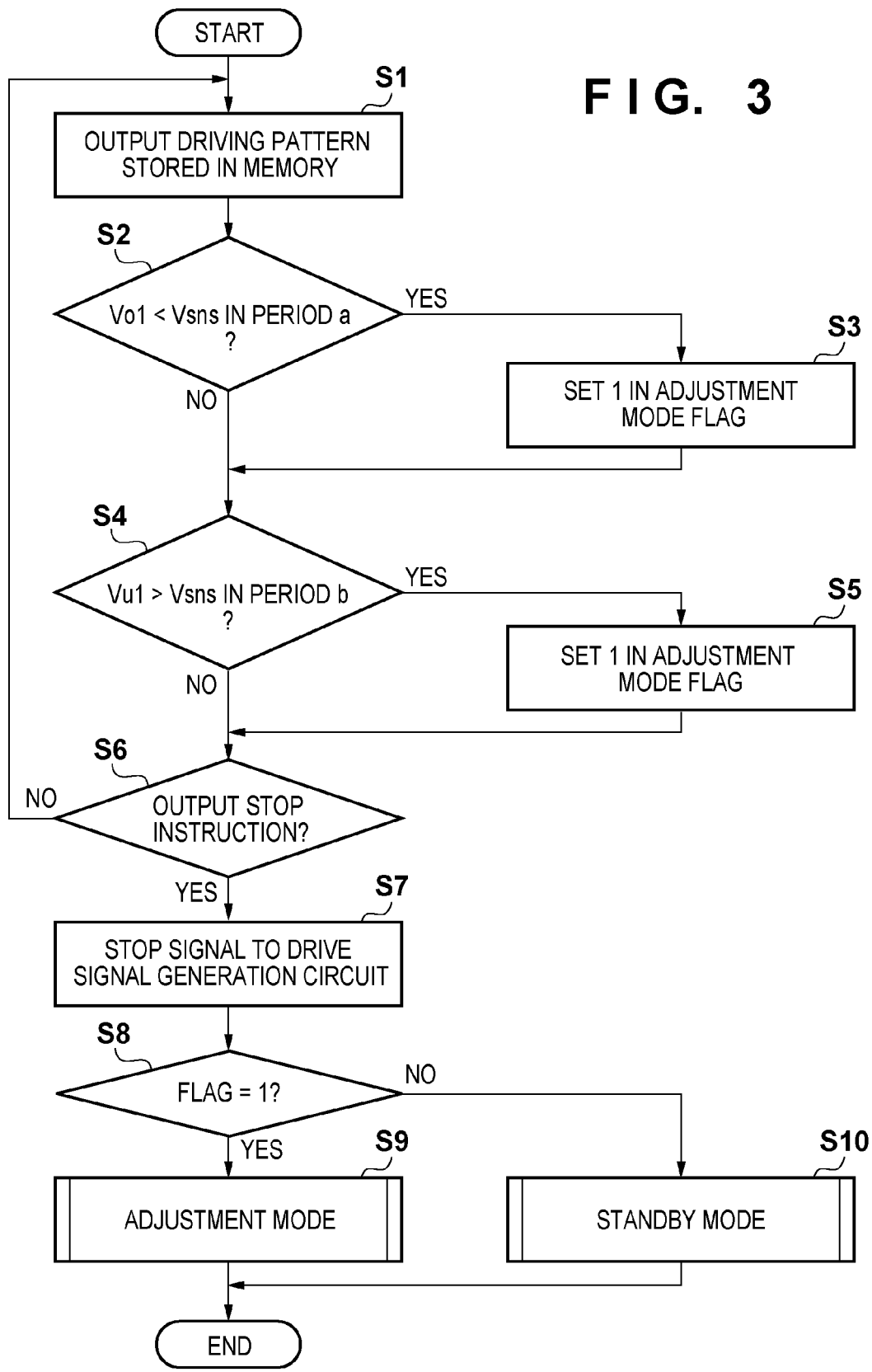
FIG. 3 is a flowchart showing a basic operation.

The basic operation of the power supply device 200 will be described with reference to FIG. 3. Upon accepting an image formation instruction from the user, the controller 210 sends an instruction to the CPU 203 to output an AC voltage having the shape of a rectangular wave. In step S1, upon receiving the output instruction from the host controller 210, the CPU 203 reads out a driving pattern stored in the memory 204 and outputs it to the drive signal generation circuit 202. The drive signal generation circuit 202 outputs a gate signal corresponding to the driving pattern to each semiconductor switching element. In response to this, the transformer T1 outputs an AC voltage to the secondary side. The AC voltage is superposed on a DC voltage output from the DC voltage source 211, generating a high voltage of a rectangular wave and applying it to the developing sleeve 41. The driving pattern was adjusted by the CPU 203 and is stored in the memory 204.

Figure 4:
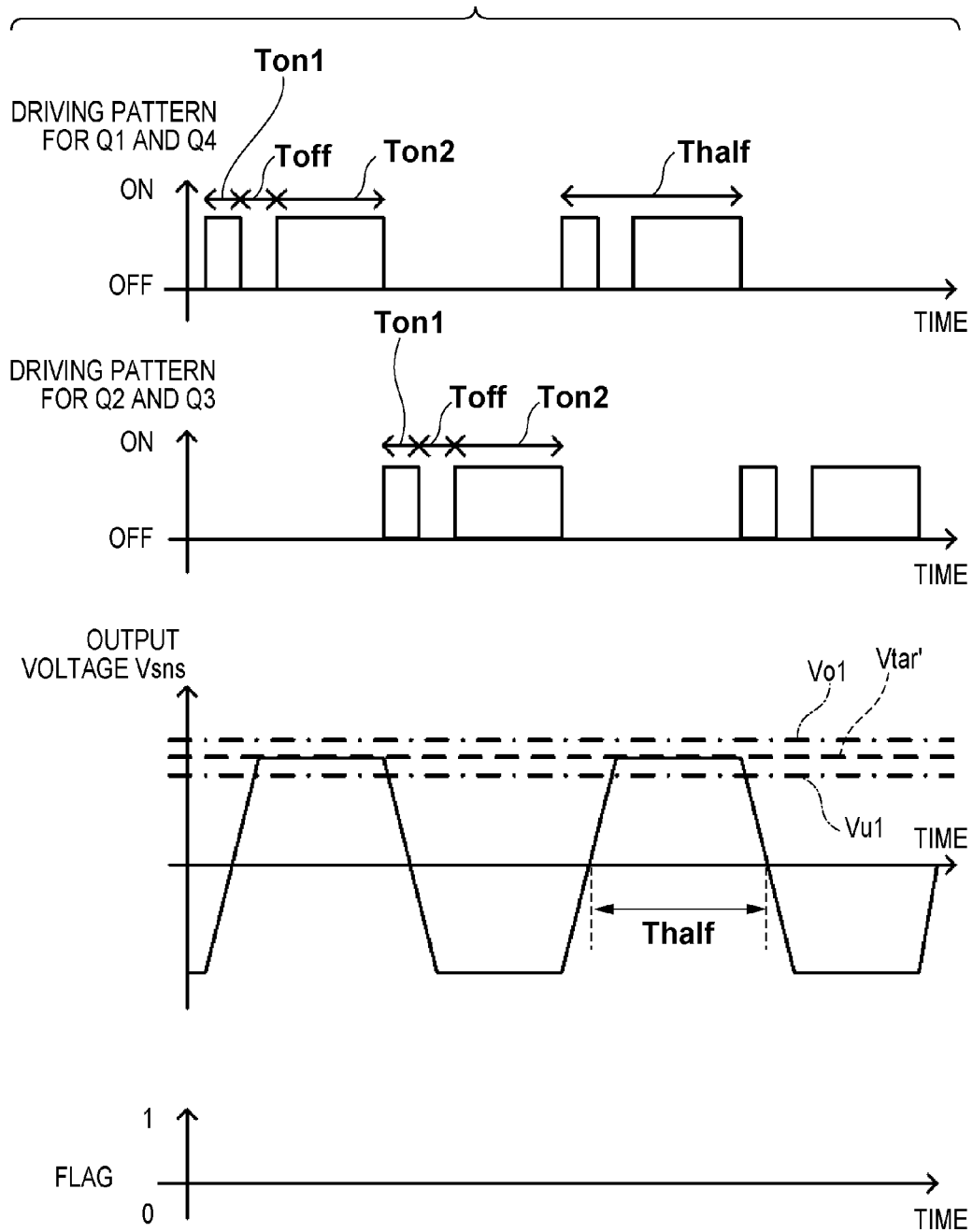
FIG. 4 is a waveform chart showing a driving pattern and the output voltage of a transformer.

FIG. 4 exemplifies driving patterns. FIG. 4 shows, sequentially from the top, a driving pattern for the semiconductor switching elements Q1 and Q4, that for the semiconductor switching elements Q2 and Q3, the output voltage Vsns, and a flag value indicating whether to shift to the adjustment mode.

Paying attention to the driving pattern for the semiconductor switching elements Q1 and Q4 and that for the semiconductor switching elements Q2 and Q3, these driving patterns repeat ON and OFF periods in every half cycle Thalf of the rectangular wave. Particularly in the embodiment, the ON period is made up of a first ON period Ton1, OFF period Toff, and second ON period Ton2. The ratio of these periods is adjusted in accordance with a distortion generated in the waveform.

In step S2, based on a comparison result output from the comparator 205 during the OFF period Toff (e.g., "PERIOD a") for the semiconductor switching elements Q1 and Q4, the CPU 203 determines whether the output voltage Vsns has exceeded the first threshold Vo1. That is, the CPU 203 functions as the second determination unit which determines whether the output voltage Vsns from the voltage converter in the OFF period has exceeded the first threshold Vo1. The comparator 205 outputs the result of comparing the output voltage Vsns and first threshold Vo1. If the output voltage Vsns has exceeded the first threshold Vo1, the waveform distortion has become impermissibly large. In this case, the process advances to step S3.

In step S3, the CPU 203 sets "1" in the flag indicating whether to shift to the adjustment mode. Note that "1" means shifting to the adjustment mode, and "0" means not shifting to the adjustment mode. If the output voltage Vsns has not exceeded the first threshold Vo1, the process need not shift to the adjustment mode and advances to step S4.

In step S4, based on the comparison result output from the comparator 206 during the second ON period (e.g., "PERIOD b") for the semiconductor switching elements Q1 and Q4, the CPU 203 determines whether the output voltage Vsns is lower than the second threshold Vu1. The CPU 203 functions as the third determination unit which determines whether an output voltage from the voltage converter in the second ON period is lower than the second threshold Vu1 smaller than the first threshold. The comparator 206 outputs the result of comparing the output voltage Vsns and second threshold Vu1. If the output voltage Vsns is lower than the threshold Vu1, the distortion has become impermissibly large. Since the driving pattern needs to be corrected, the process advances to step S5.

In step S5, the CPU 203 sets "1" in the flag indicating whether to shift to the adjustment mode. If the output voltage Vsns is equal to or higher than the second threshold Vu1, the process need not shift to the adjustment mode and advances to step S6.

Note that the flag is kept latched till a reset instruction once "1" is set in step S3 or S5. The CPU 203 notifies even the host controller 210 of the flag value.

In step S6, the CPU 203 determines whether it has received a rectangular wave output stop instruction from the host controller 210. If the CPU 203 has not received an output stop instruction, the process returns to step S1 to keep outputting the rectangular wave. If the CPU 203 has received an output stop instruction, the process advances to step S7.

In step S7, the CPU 203 stops output of the rectangular wave.

In step S8, the CPU 203 determines whether it has received an instruction from the host controller 210 to shift to the adjustment mode. The host controller 210 determines in advance whether the flag notified from the CPU 203 is "1" (whether to shift to the adjustment mode). If the flag is "1", the host controller 210 transmits an instruction to the CPU 203 to shift to the adjustment mode. Upon receiving the adjustment mode shift instruction, the CPU 203 advances to step S9.

In step S9, the CPU 203 shifts to the adjustment mode for adjusting the driving pattern. In this manner, the CPU 203 adjusts the driving pattern when an output voltage from the voltage converter in the OFF period has exceeded the first threshold or an output voltage from the transformer T1 in the second ON period is lower than the second threshold.

If the flag is "0", the process advances to step S10, and the host controller 210 transmits an instruction to the CPU 203 to shift to the standby mode. Upon receiving the standby mode shift instruction, the CPU 203 advances to step S10. In step S10, the CPU 203 shifts to the standby mode to wait for an output instruction from the host controller 210.

Cases in which the driving pattern needs to be adjusted will be explained with reference to FIGS. 5A and 5B. FIGS. 5A and 5B also show, sequentially from the top, a driving pattern for the semiconductor switching elements Q1 and Q4, that for the semiconductor switching elements Q2 and Q3, the output voltage Vsns, and a flag value indicating whether to shift to the adjustment mode.

An arrow in FIG. 5A indicates a case in which the output voltage Vsns has exceeded the first threshold Vo1 in the OFF period Toff. When the waveform of a rectangular wave is distorted greatly enough to generate such an upward overshoot, the driving pattern needs to be adjusted.

An arrow in FIG. 5B indicates a case in which the output voltage Vsns becomes lower than the second threshold Vu1 in the second ON period Ton2. When the waveform of a rectangular wave is distorted greatly enough to generate such a downward overshoot, the driving pattern needs to be adjusted.

[Adjustment Mode]

Figure 6:
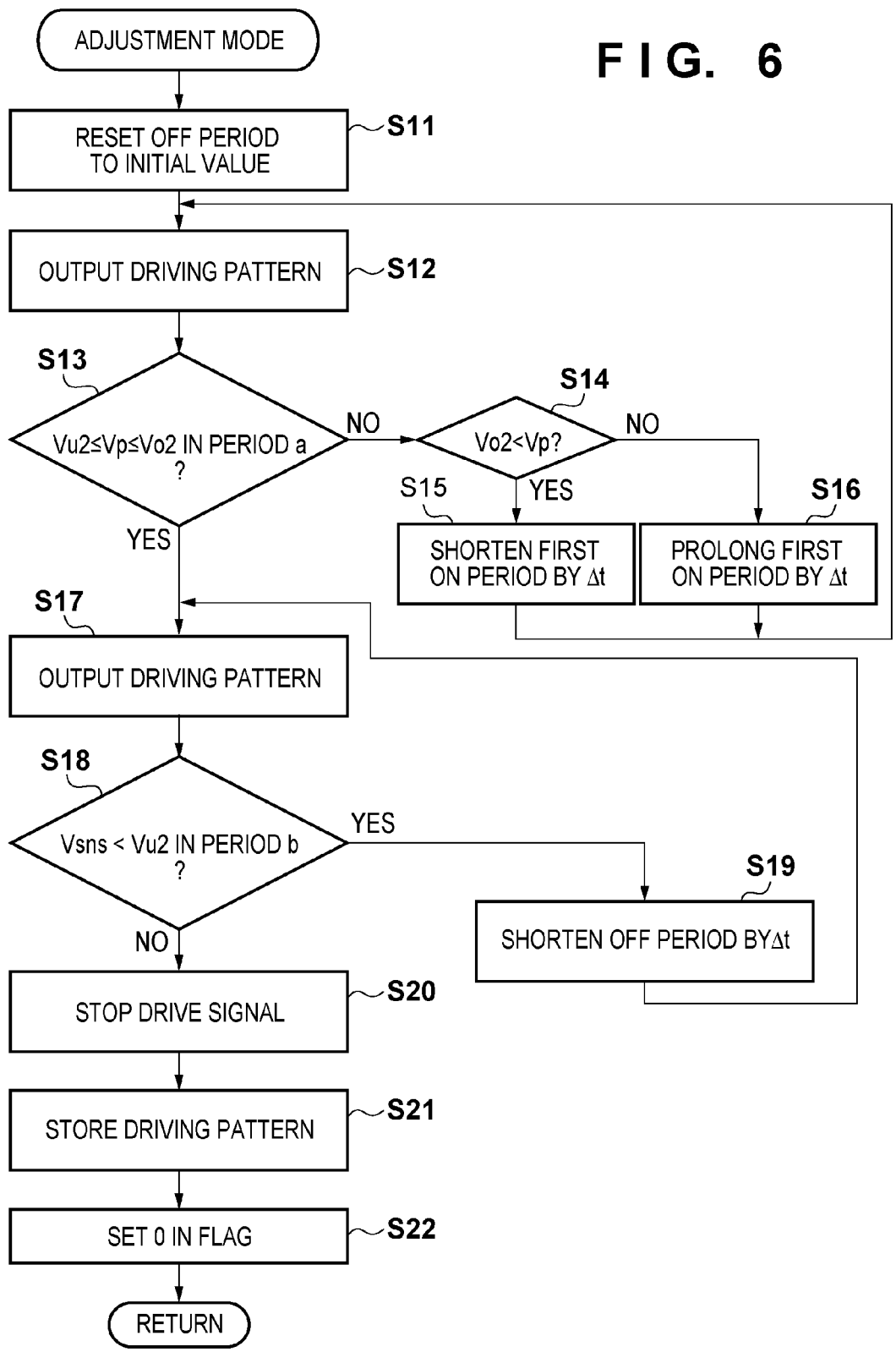
FIG. 6 is a flowchart showing an adjustment mode.

The adjustment mode will be explained with reference to FIG. 6. In step S11, the CPU 203 resets the value of the OFF period Toff to an initial value. The initial value of the OFF period Toff is determined by taking account of the variation range of LC resonance on the secondary side of the transformer T1. An example is the maximum value of an OFF period settable by the CPU 203. In the embodiment, the OFF period Toff and first ON period Ton1 are changed first, but the half cycle Thalf of the rectangular wave is kept constant. After adjusting the lengths of the first ON period and half-wave OFF period Toff, the second ON period Ton2 is adjusted to maintain the sum of the first ON period Ton1, OFF period Toff, and second ON period to be equal to the half cycle Thalf.

In step S12, the CPU 203 outputs, to the drive signal generation circuit 202, a new driving pattern generated by adjusting the first ON period Ton1, OFF period Toff, and second ON period Ton2.

In step S13, the CPU 203 determines whether a waveform distortion is generated in the output voltage. For example, the CPU 203 determines whether the output voltage Vsns acquired in the OFF period Toff (e.g., "PERIOD a") is equal to or lower than a third threshold Vo2 and equal to or higher than a fourth threshold Vu2. At this time, the peak detection circuit 208 acquires the output voltage Vsns in the OFF period Toff in every cycle, and holds the peak voltage Vp having a maximum value. When the OFF period ends and shifts to the second ON period, the comparator 207 compares the output voltage Vp with the third threshold Vo2, and also compares the output voltage Vp with the fourth threshold Vu2. The CPU 203 receives the comparison results from the comparator 207. If the output voltage Vsns is higher than the third threshold Vo2 or lower than the fourth threshold Vu2, the process advances to step S14. In this fashion, the CPU 203 functions as a distortion detection unit which detects a waveform distortion generated in an output voltage from the voltage converter. The voltage detection circuit 209 and peak detection circuit 208 function as the first voltage detection unit which detects the peak voltage Vp of the output voltage from the voltage converter in the OFF period. The comparator 207 and CPU 203 function as the fourth determination unit which determines whether the peak voltage has exceeded the third threshold Vo2.

Note that the determination processing in step S13 includes determining whether the magnitude of the peak voltage Vp as a response to power input in the first ON period falls within a target voltage range. That is, the CPU 203 functions as the sixth determination unit which determines whether the output voltage of the voltage converter falls within a range whose upper limit is the third threshold Vo2 and whose lower limit is the fourth threshold Vu2. Also, the CPU 203 functions as a distortion detection unit which determines that no distortion is generated when the output voltage of the voltage converter falls within the range, and a distortion is generated when the output voltage of the voltage converter falls outside the range. Note that the third threshold Vo2 satisfies a condition Vtar<Vo2<Vo1, and the fourth threshold Vu2 satisfies a condition Vtar>Vu2>Vu1. If Vu2<Vp<Vo2 is satisfied, Vu1<Vp<Vo1 is satisfied.

In step S14, the CPU 203 determines whether the output voltage Vp has exceeded the third threshold Vo2. The output voltage Vp exceeds the third threshold Vo2 when the first ON period Ton1 is excessively long. In this case, the process advances to step S15.

In step S15, the CPU 203 adjusts the first ON period Ton1 by subtracting a predetermined adjustment time Δt from the first ON period Ton1 set in the current driving pattern.

To the contrary, the output voltage Vp becomes lower than the fourth threshold Vu2 when the first ON period Ton1 is excessively short. In this case, the process advances to step S16.

In step S16, the CPU 203 adjusts the first ON period Ton1 by adding the predetermined adjustment time Δt to the first ON period Ton1 set in the current driving pattern.

In this way, the CPU 203 functions as an adjustment unit which shortens the first ON period when the peak voltage has exceeded the third threshold, and prolongs it when the peak voltage has not exceeded the third threshold. The process then returns to step S12.

If the output voltage Vsns acquired in the OFF period Toff falls within the range of the third threshold Vo2 to the fourth threshold Vu2 in step S13, no driving pattern need be adjusted. That is, the driving pattern has been adjusted satisfactorily in adjustment step S15 or S16. In this case, the process shifts to step S17.

In step S17, the CPU 203 outputs the adjusted driving pattern to the drive signal generation circuit 202.

After the peak voltage Vp in a given cycle falls within the predetermined range, the CPU 203 monitors and detects the output voltage Vsns in the second ON period using the voltage detection circuit 209 from the next cycle. The voltage detection circuit 209 functions as the second voltage detection unit which detects the output voltage Vsns from the voltage converter in the second ON period.

In step S18, the CPU 203 determines using the comparator 206 whether the output voltage Vsns in the second ON period (e.g., "PERIOD b") is lower than the fourth threshold Vu2. That is, the CPU 203 functions as the fifth determination unit which determines whether the output voltage Vsns detected by the second voltage detection unit is lower than the fourth threshold Vu2. The CPU 203 has changed in advance the threshold for the comparator 206 from the second threshold Vu1 to the fourth threshold Vu2. As described above, the OFF period Toff is set to a maximum value (initial value) at the beginning of the adjustment mode. Hence, the OFF period never becomes too short, and it suffices to consider only the case in which the OFF period is too long. It therefore suffices to compare the output voltage Vsns with the fourth threshold Vu2 serving as a lower limit threshold. If the comparison result of the comparator 206 indicates that an output voltage Vsns lower than the fourth threshold Vu2 has been detected, the process advances to step S19.

In step S19, the CPU 203 adjusts the OFF period Toff by subtracting the predetermined adjustment time Δt from the OFF period Toff. That is, the CPU 203 functions as an adjustment unit which shortens the OFF period when the output voltage Vsns detected by the second voltage detection unit is lower than the fourth threshold. After that, the process returns to step S17. The adjustment result is reflected in a driving pattern in the next cycle.

If the comparison result of the comparator 206 indicates that an output voltage Vsns lower than the fourth threshold Vu2 has not been detected, it means that the waveform distortion has become satisfactorily small. In this case, the process advances to step S20.

In step S20, the CPU 203 stops output of the driving pattern. The CPU 203 functions as an adjustment unit which does not adjust the OFF period if the output voltage Vsns detected by the second voltage detection unit is equal to or higher than the fourth threshold.

In step S21, the CPU 203 stores, in the memory 204, the adjusted driving pattern, that is, the parameters of the first ON period Ton1, OFF period Toff, and second ON period Ton2.

Finally in step S22, the CPU 203 resets the flag to "0", ending the adjustment mode. From the next image formation, the driving pattern stored in the memory 204 is output to the drive signal generation circuit 202.

FIGS. 7A, 7B, 8A, and 8B show measured waveforms during adjustment. FIGS. 7A, 7B, 8A, and 8B show, sequentially from the top, a driving pattern for the semiconductor switching elements Q1 and Q4, that for the semiconductor switching elements Q2 and Q3, and the output voltage Vsns.

Figure 7A:
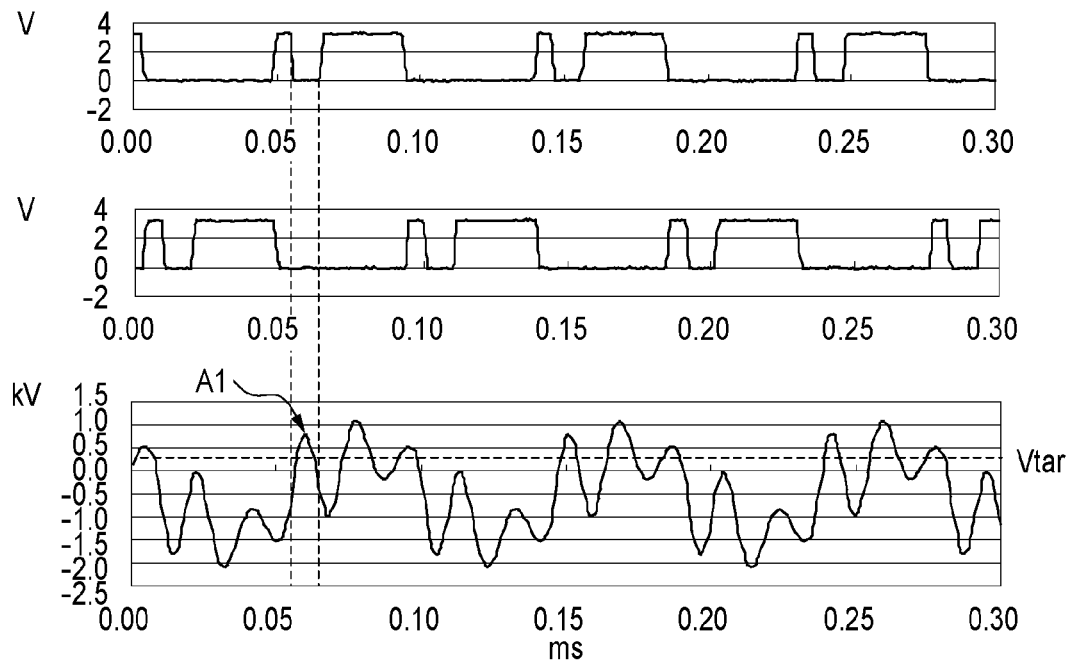
FIGS. 7A and 7B are waveform charts exemplifying respective waveforms during adjustment.

FIG. 7A shows respective waveforms when the peak voltage Vp is higher than the third threshold Vo2 in step S13. An arrow A1 indicates the peak voltage Vp (>Vo2) in the OFF period.

Figure 7B:
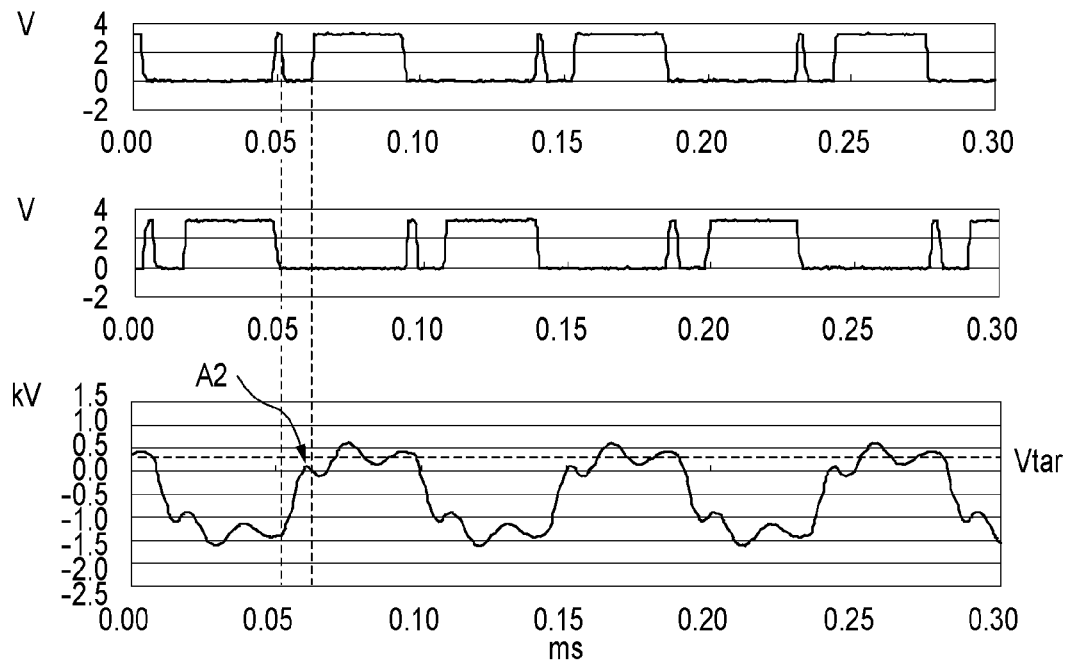

FIG. 7B shows respective waveforms when the peak voltage Vp is lower than the fourth threshold Vu2 in step S13. An arrow A2 indicates the peak voltage Vp (<Vu2) in the OFF period.

Figure 8A:
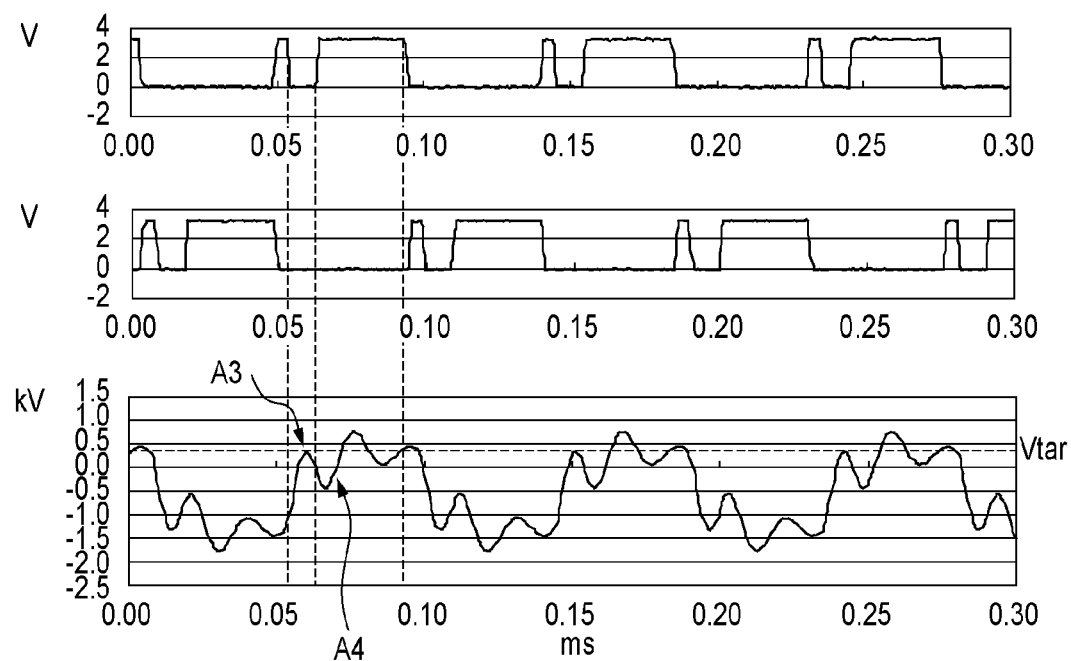
FIGS. 8A and 8B are waveform charts exemplifying respective waveforms during adjustment.

FIG. 8A shows respective waveforms when the first ON period Ton1 is adjusted in step S15 or S16. An arrow A3 indicates Vp which is equal to or higher than Vu2 and equal to or lower than Vo2 in the OFF period. An arrow A4 indicates a state in which Vsn<Vu2 in the second ON period.

Figure 8B:
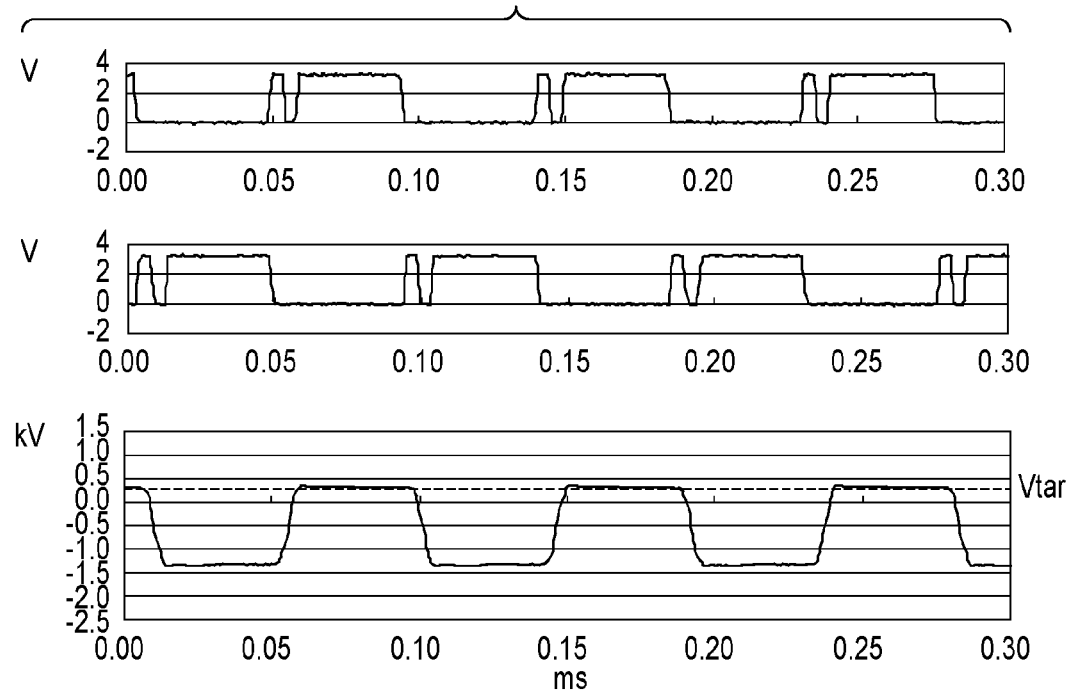

FIG. 8B shows respective waveforms at the end of even adjustment of the OFF period. A shaped rectangular wave is obtained through a process of FIG. 7A→FIG. 8A→FIG. 8B or FIG. 7B→FIG. 8A→FIG. 8B.

For descriptive convenience, a waveform with a large resonance amplitude has been exemplified by giving priority to visibility. In practice, the first threshold Vo1 and second threshold Vu1 are set to a range in which an error does not affect development. The third threshold Vo2, fourth threshold Vu2, and predetermined adjustment time Δt are set to controllable resolutions.

The above-described comparators 205, 206, and 207 and the peak detection circuit 208 may be implemented by analog circuits or by calculating, by the CPU 203, data acquired via an A/D converter.

The thresholds Vo1, Vu1, Vo2, and Vu2, OFF period Toff, second ON period Ton2, and peak voltage Vp are set to positive amplitudes for descriptive convenience, but may be set to negative amplitudes. The signs of them may be set independently.

The end timing of the second ON period Ton2 has been assumed to coincide with the switching timing of a half-wave. However, the end timing of the second ON period Ton2 may precede the switching timing as long as the second ON period Ton2 is longer than one resonance cycle derived from assumed variations of the resonance frequency.

In step S2 of the basic operation according to the embodiment, the comparator 205 compares the output voltage Vsns in the OFF period Toff with the first threshold Vo1. Instead of this, the peak detection circuit 208 may compare the peak voltage Vp with the first threshold Vo1, and based on the comparison result, the CPU 203 may determine whether to set the flag to "1".

In the above description, the flag indicating whether to shift to the adjustment mode is set to "1" once the threshold condition is satisfied. However, to avoid a malfunction, the host controller 210 may include a counter, and when the threshold condition is satisfied N times (N is a natural number of 1 or more), the flag may be set to "1". Alternatively, the host controller 210 may include a timer, and when the threshold condition is kept satisfied for a predetermined time, the flag may be set to "1".

According to the first embodiment, the CPU 203 adjusts the ratio of the first ON period, OFF period, and second ON period to reduce a waveform distortion. The shape of a rectangular wave can be maintained even if the magnitude of the inductance or capacitance changes dynamically. As a result, stable development can be achieved while decreasing dependence on a damping resistor.

In the first embodiment, whether to perform the adjustment mode is determined based on whether the output voltage falls within a target voltage range determined when the image forming apparatus was designed. For example, the adjustment mode is performed when an output voltage measured in the OFF period has exceeded the first threshold Vo1. Also, the adjustment mode is performed when an output voltage measured in the second ON period is lower than the second threshold Vu1. A voltage to be supplied to the image forming apparatus can be controlled to fall within a range assumed in design.

In the first embodiment, the first ON period is shortened if the peak voltage measured in the OFF period has exceeded the third threshold Vo2, and prolonged if it has not exceeded the third threshold. By prolonging/shortening the first ON period, the peak voltage in the OFF period can fall within a range assumed in design. If the output voltage is lower than the fourth threshold Vu2, the OFF period is shortened, making the output voltage fall within a range assumed in design.

Second Embodiment

In the first embodiment, whether to perform adjustment is determined based on the value of the output voltage Vsns from the transformer T1. In the second embodiment, a host controller 210 determines, based on the number of times of the image formation, whether to perform adjustment. It is also possible to combine the first and second embodiments and perform adjustment when the flag is set to "1" according to the first or second embodiment. A description of matters common to the first embodiment will not be repeated.

Figure 9:
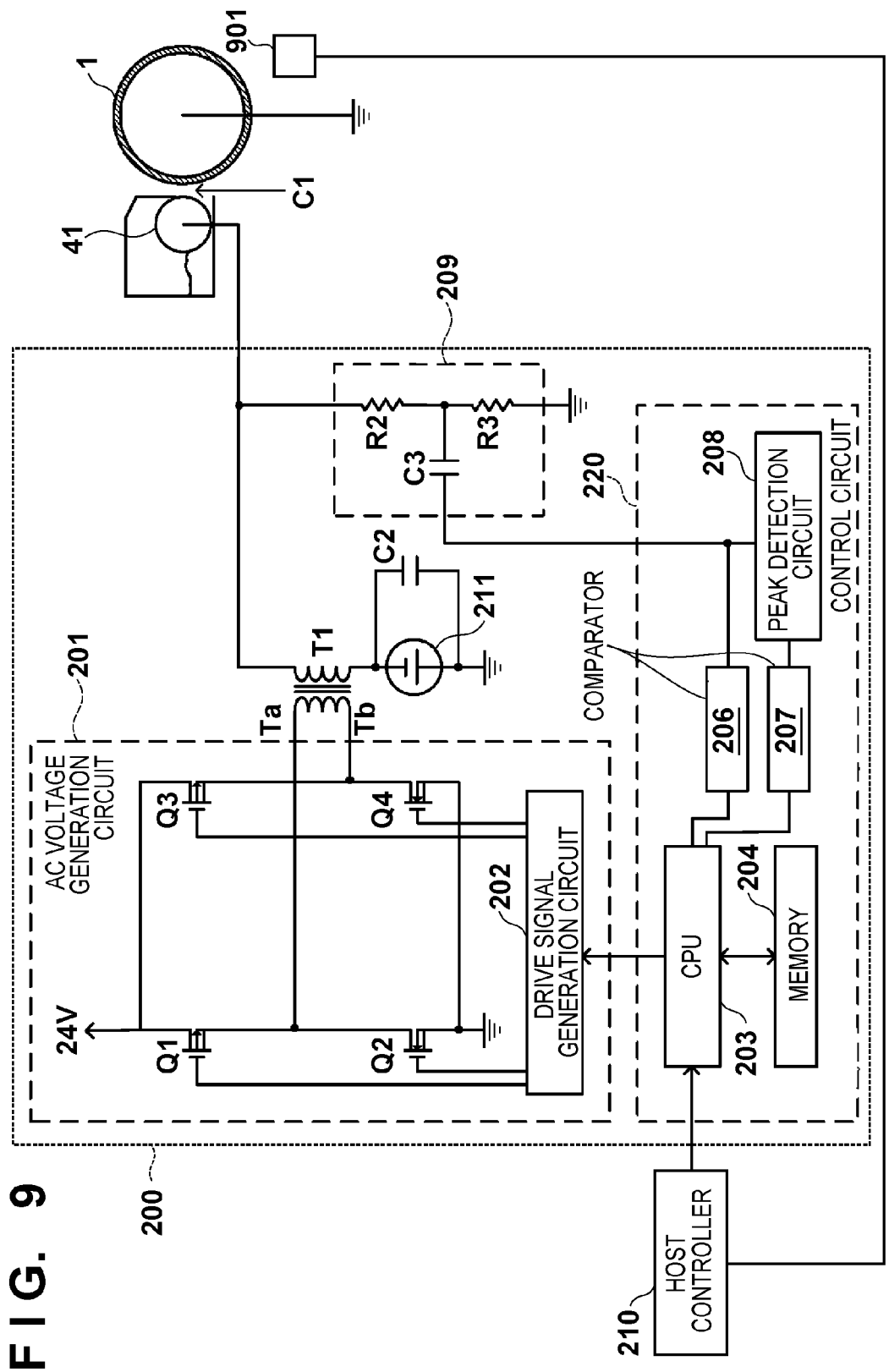
FIG. 9 is a circuit diagram showing a power supply device.

A power supply device 200 according to the second embodiment shown in FIG. 9 is almost the same as the power supply device 200 shown in FIG. 2 except that no comparator 205 is arranged and a memory tag 901 is added to a process cartridge which stores a photosensitive member 1. The memory tag 901 is a nonvolatile storage device which stores the number of times of the image formation.

In general, as the photosensitive member 1 executes the image forming process many times, a photosensitive layer on its surface is abraded, degrading the image carrier function. The service life of the photosensitive member 1 is shorter than that of an image forming apparatus 100. That is, the photosensitive member 1 is a consumable part which is exchanged periodically or as needed. When the photosensitive member 1 is exchanged, the distance d between the photosensitive member 1 and a developing sleeve 41 may change because of variations of the photosensitive member 1, the mounting tolerance, or the like. When the gap distance d changes, even the value of the capacitance C1 formed by the gap changes. For this reason, when exchange of the photosensitive member 1 is detected, the host controller 210 needs to adjust the driving pattern. Exchange of the photosensitive member 1 can be detected from the number of times of the image formation that is stored in the memory tag 901. If the number of times of the image formation is smaller than a predetermined number, it is considered that the photosensitive member 1 has been exchanged recently.

Figure 10:
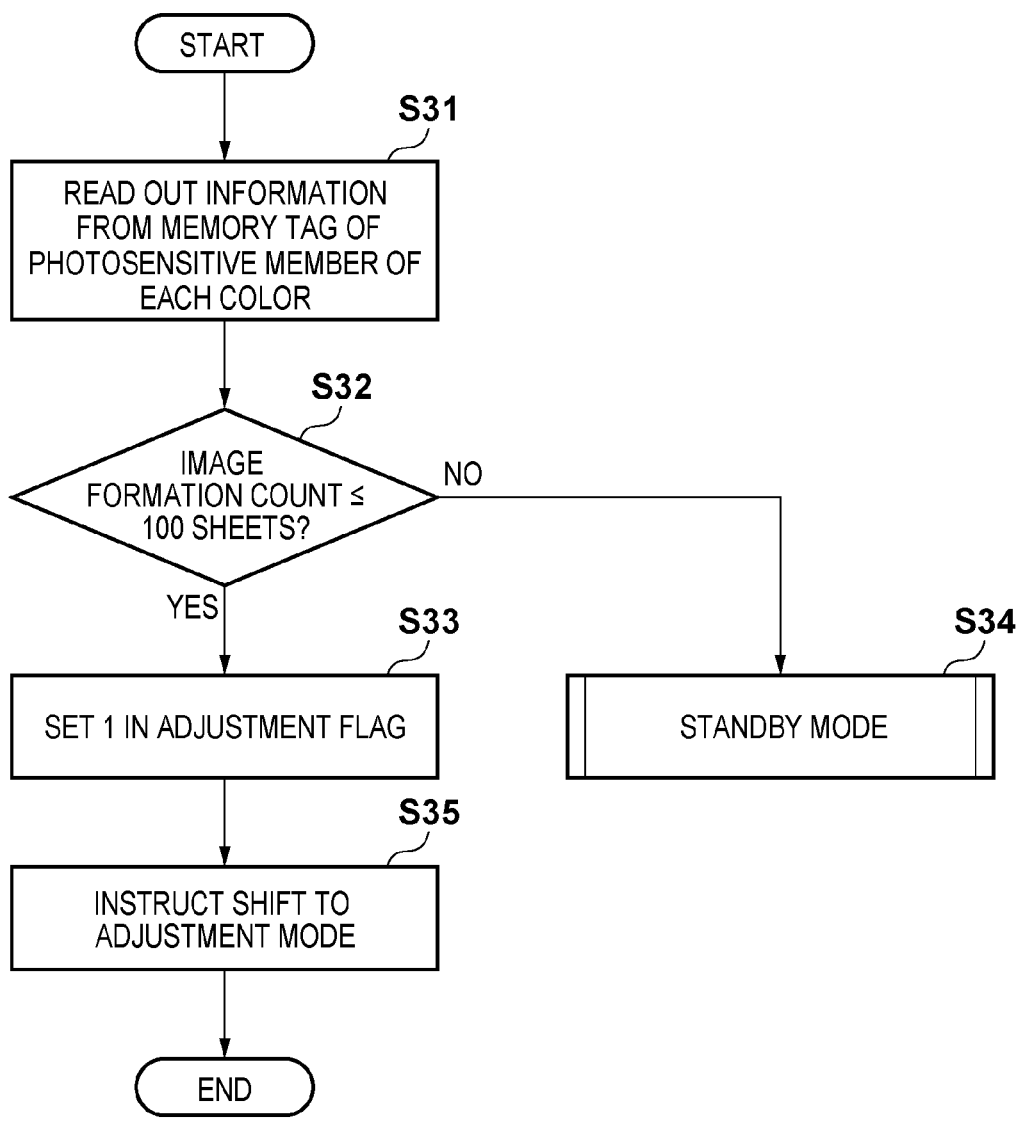
FIG. 10 is a flowchart showing processing of determining whether to trigger the adjustment mode.

Determination processing of whether to shift to the adjustment mode will be explained with reference to a flowchart shown in FIG. 10. The photosensitive member 1 is generally exchanged while the power supply device 200 of the image forming apparatus 100 is OFF. In step S31, when the image forming apparatus 100 is powered, the host controller 210 checks the state of the photosensitive member 1 of each color. The process cartridge of the photosensitive member 1 includes the memory tag 901 which records the image formation count. In every image forming operation, the host controller 210 writes the accumulated image formation count in the memory tag 901. The host controller 210 manages the image formation count for the photosensitive member 1 of each color. The host controller 210 functions as a counting unit which counts the number of times of the image formation. The host controller 210 read out information indicating the image formation count from the memory tag 901.

In step S32, the host controller 210 determines whether the photosensitive member 1 of each color requires adjustment of the driving pattern. For example, the host controller 210 determines whether the read out image formation count is equal to or smaller than a predetermined sheet count. In this fashion, the host controller 210 functions as the first determination unit which determines whether the number of times of the image formation counted by the counting unit is equal to or smaller than a predetermined number. If there is no photosensitive member 1 whose image formation count is equal to or smaller than a predetermined sheet count, the process advances to step S34.

In step S34, the host controller 210 shifts to the standby mode to wait for image formation. A CPU 203 functioning as an adjustment unit does not adjust the driving pattern unless the number of times of the image formation is equal to or smaller than a predetermined number.

If there is a photosensitive member 1 whose image formation count is equal to or smaller than a predetermined sheet count (for example, 100 sheets), the process advances to step S33.

In step S33, the host controller 210 sets "1" in the flag of the color.

In step S35, the host controller 210 instructs the CPU 203 to shift to the adjustment mode. The adjustment mode has been described in the first embodiment. The CPU 203 adjusts the driving pattern if the number of times of the image formation is equal to or smaller than a predetermined number.

In the second embodiment, the driving pattern is adjusted if the photosensitive member 1 of even one of a plurality of colors is exchanged. However, the time taken to perform the adjustment mode hardly changes regardless of the number of colors. Thus, when the photosensitive member 1 of even one color is exchanged, the adjustment mode may be exchanged for image forming stations of all colors.

The predetermined sheet count may be 100 sheets or 0 sheet as an extreme case. The predetermined number of sheets is merely set to 100 to perform adjustment upon every power-on event until the operation stabilizes after the photosensitive member 1 is mounted.

The second embodiment pays attention to exchange of the photosensitive member 1 which determines the magnitude of the capacitance C1 generated at the gap. However, the operation may shift to the adjustment mode at various preset timings, for example, when toner replenishment is done, when a developing unit 4 is exchanged, when image formation has been executed a predetermined number of times, or when the image forming apparatus is powered. Whether these conditions have been satisfied may be determined by the host controller 210 or another control circuit such as the CPU 203.

According to the second embodiment, the ratio of the first ON period, OFF period, and second ON period is adjusted to reduce a waveform distortion. The shape of a rectangular wave can be maintained even if the magnitude of the inductance or capacitance on the secondary side of the voltage converter changes dynamically. Stable development can then be achieved while decreasing dependence on a damping resistor.

In the first and second embodiments, the power supply circuit in the image forming apparatus applies a rectangular wave to the developing sleeve. However, the technical idea of the present invention may be applied to another electronic device. The present invention will be effective in a case in which the resonant waveform with the leakage inductance or the load capacitance or stray capacitance is to be reduced in a circuit which outputs an impulse or stepped waveform using a voltage converter such as a transformer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-209883, filed Sep. 17, 2010, which is hereby incorporated by reference herein in its entirety.

What is claimed is:

1. A power supply circuit comprising:
    an alternating current voltage generation unit which generates an alternating current voltage having a shape of a rectangular wave;
    a voltage conversion unit which converts the alternating current voltage generated by said alternating current voltage generation unit into a predetermined output voltage; and
    an adjustment unit which monitors the output voltage and adjusts a driving pattern for driving said alternating current voltage generation unit in accordance with a waveform distortion generated in a rectangular wave of the output voltage,
    wherein the driving pattern is a pattern having, in a half cycle of the rectangular wave of the alternating current voltage, a first ON period during which the alternating current voltage is applied to said voltage conversion unit, an OFF period during which the alternating current voltage is not applied to said voltage conversion unit, and a second ON period during which the alternating current voltage is applied to said voltage conversion unit, and
    said adjustment unit adjusts a ratio of the first ON period, the OFF period, and the second ON period so that the waveform distortion decreases.

2. The circuit according to claim 1, wherein said adjustment unit adjusts a length of the first ON period to make a peak value of the output voltage in the OFF period fall within a predetermined range, and adjusts a length of the OFF period to make the output voltage in the second ON period be not lower than a lower limit of the predetermined range.

3. The circuit according to claim 2, further comprising:
    a counting unit which counts the number of times of an image formation; and
    a first determination unit which determines whether the number of times of the image formation counted by said counting unit is not larger than a predetermined number of sheets,
    wherein said adjustment unit performs adjustment of the driving pattern when the number of times of the image formation is not larger than the predetermined number, and does not perform adjustment of the driving pattern when the number of times of the image formation is larger than the predetermined number.

4. The circuit according to claim 2, further comprising:
    a second determination unit which determines whether the output voltage from said voltage conversion unit in the OFF period has exceeded a first threshold (Vo1); and
    a third determination unit which determines whether the output voltage from said voltage conversion unit in the second ON period is lower than a second threshold smaller than the first threshold,
    wherein said adjustment unit performs adjustment of the driving pattern when the output voltage from said voltage conversion unit in the OFF period has exceeded the first threshold or the output voltage from said voltage conversion unit in the second ON period is lower than the second threshold.

5. The circuit according to claim 4, further comprising a distortion detection unit which detects a waveform distortion generated in the output voltage from said voltage conversion unit, said distortion detection unit including:

a first voltage detection unit which detects a peak voltage of the output voltage from said voltage conversion unit in the OFF period; and a fourth determination unit which determines whether the peak voltage has exceeded a third threshold, wherein said adjustment unit shortens the first ON period when the peak voltage has exceeded the third threshold, and prolongs the first ON period if the peak voltage has not exceeded the third threshold.

6. The circuit according to claim 5, wherein said distortion detection unit includes a second voltage detection unit which detects an output voltage from said voltage conversion unit in the second ON period, and a fifth determination unit which determines whether the output voltage detected by said second voltage detection unit is lower than the fourth threshold, and said adjustment unit shortens the OFF period when the output voltage detected by said second voltage detection unit is lower than the fourth threshold, and does not adjust the OFF period when the output voltage detected by said second voltage detection unit is not lower than the fourth threshold.

7. The circuit according to claim 6, wherein the first threshold is larger than the third threshold, and the second threshold is smaller than the fourth threshold.

8. The circuit according to claim 6, wherein said adjustment unit adjusts the first ON period and then the OFF period.

9. The circuit according to claim 6, wherein said distortion detection unit includes a sixth determination unit which determines whether the output voltage of said voltage conversion unit falls within a range whose upper limit is the third threshold and whose lower limit is the fourth threshold, and said distortion detection unit determines that no distortion is generated when the output voltage of said voltage conversion unit falls within the range, and a distortion is generated when the output voltage of said voltage conversion unit falls outside the range.

10. An image forming apparatus comprising:

a power supply circuit;

a developing member to which a voltage supplied from said power supply circuit is applied;

an image carrier which bears an electrostatic latent image that is developed with a developing agent supplied from said developing member; and a transferring member which transfers a developing agent image from the image carrier onto a printing medium, said power supply circuit including:

an alternating current voltage generation unit which generates an alternating current voltage having a shape of a rectangular wave;

a voltage conversion unit which converts the alternating current voltage generated by said alternating current voltage generation unit into a predetermined output voltage; and an adjustment unit which monitors the output voltage and adjusts a driving pattern for driving said alternating current voltage generation unit in accordance with a waveform distortion generated in a rectangular wave of the output voltage, wherein the driving pattern is a pattern having, in a half cycle of the rectangular wave of the alternating current voltage, a first ON period during which the alternating current voltage is applied to said voltage conversion unit, an OFF period during which the alternating current voltage is not applied to said voltage conversion unit, and a second ON period during which the alternating current voltage is applied to said voltage conversion unit, and said adjustment unit adjusts a ratio of the first ON period, the OFF period, and the second ON period so that the waveform distortion decreases.

* * * * *